(12) United States Patent
Eckberg et al.

(10) Patent No.: US 7,999,179 B2
(45) Date of Patent: Aug. 16, 2011

(54) BIASED AIR BAFFLE FOR COMPUTER RACK

(75) Inventors: Eric Alan Eckberg, Rochester, MN (US); James Dorance Gerken, Zumbro Falls, MN (US); John Theodore Gullicksrud, Rochester, MN (US); Stephen Peter Mroz, Rochester, MN (US); Scott Alan Shruson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 765 days.

(21) Appl. No.: 12/107,026

(22) Filed: Apr. 21, 2008

(65) Prior Publication Data

US 2009/0260874 A1    Oct. 22, 2009

(51) Int. Cl.
*H05K 5/00*    (2006.01)

(52) U.S. Cl. ...... 174/50; 174/17 VA; 174/650; 361/676; 361/694; 361/796; 454/184

(58) Field of Classification Search ............ 174/50, 174/17 R, 17 VA, 650, 520; 361/600, 601, 361/679.01, 679.02, 679.46, 688, 694, 724, 361/727, 796, 679; 312/223.1, 223.6; 454/184

See application file for complete search history.

(56) References Cited

U.S. PATENT DOCUMENTS

| 5,560,084 | A  |   | 10/1996 | Baker |  |
| 5,689,097 | A  | * | 11/1997 | Aufermann et al. | 361/676 |
| 5,789,707 | A  |   | 8/1998  | Damm et al. |  |
| 6,000,464 | A  | * | 12/1999 | Scafidi et al. | 361/724 |
| 6,365,826 | B1 | * | 4/2002  | Stendardo et al. | 174/50 |
| 6,407,331 | B1 | * | 6/2002  | Smith et al. | 174/50 |
| 6,417,443 | B1 | * | 7/2002  | Smith | 174/50 |
| 6,717,055 | B2 |   | 4/2004  | Kato |  |
| 6,763,550 | B2 |   | 7/2004  | Regnier |  |
| 7,379,299 | B2 | * | 5/2008  | Walsh et al. | 454/184 |
| 7,394,654 | B2 | * | 7/2008  | Zieman et al. | 454/184 |
| 7,643,291 | B2 | * | 1/2010  | Mallia et al. | 454/184 |
| 7,821,774 | B2 | * | 10/2010 | Josten et al. | 174/17 VA |
| 7,898,799 | B2 | * | 3/2011  | Doll | 454/184 |
| 7,907,402 | B2 | * | 3/2011  | Caveney | 361/694 |

FOREIGN PATENT DOCUMENTS

CN    1710239 A    12/2005

* cited by examiner

*Primary Examiner* — Angel R Estrada
(74) *Attorney, Agent, or Firm* — Cynthia G. Seal; Jeffrey L. Streets

(57) ABSTRACT

One embodiment provides an air baffle assembly for controlling airflow through a cable opening in a rack. The rack is configured for removably supporting a plurality of modular electronic components. The cable opening on the rack receives a plurality of cables connected to the modular electronic components. The air baffle assembly includes a track secured to the rack adjacent to the cable opening and an air baffle movably supported on the track over the cable opening. The track includes a rail guideway. The air baffle includes at least a flexible first rail movably received by the first rail guideway. The first rail flares laterally along a range of engagement of the first rail with the first rail guideway, to bias the air baffle in one longitudinal direction.

20 Claims, 5 Drawing Sheets

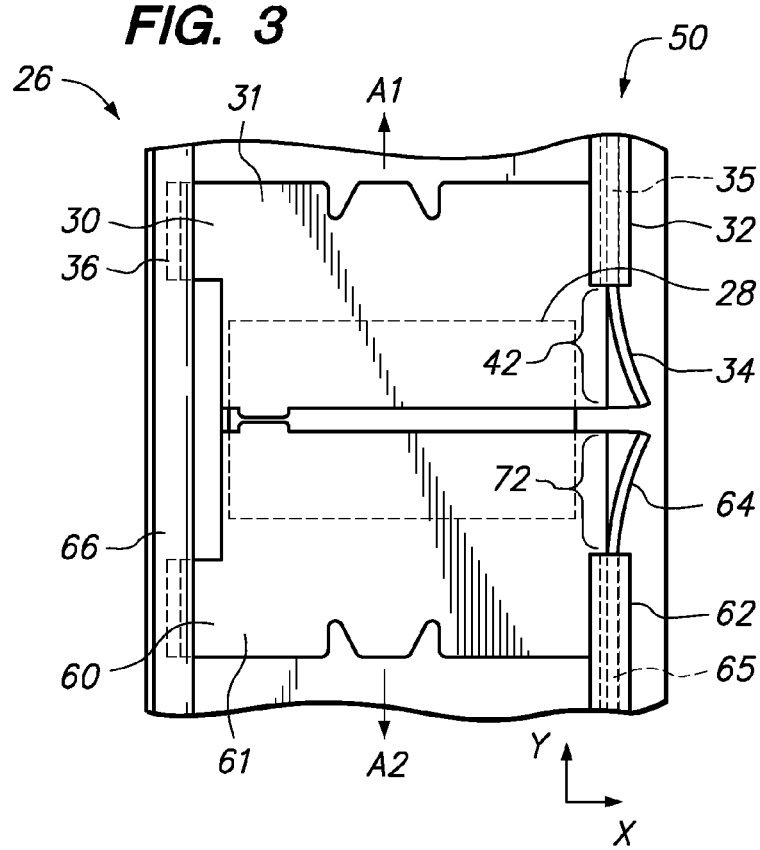
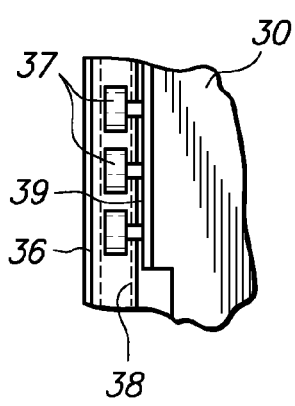
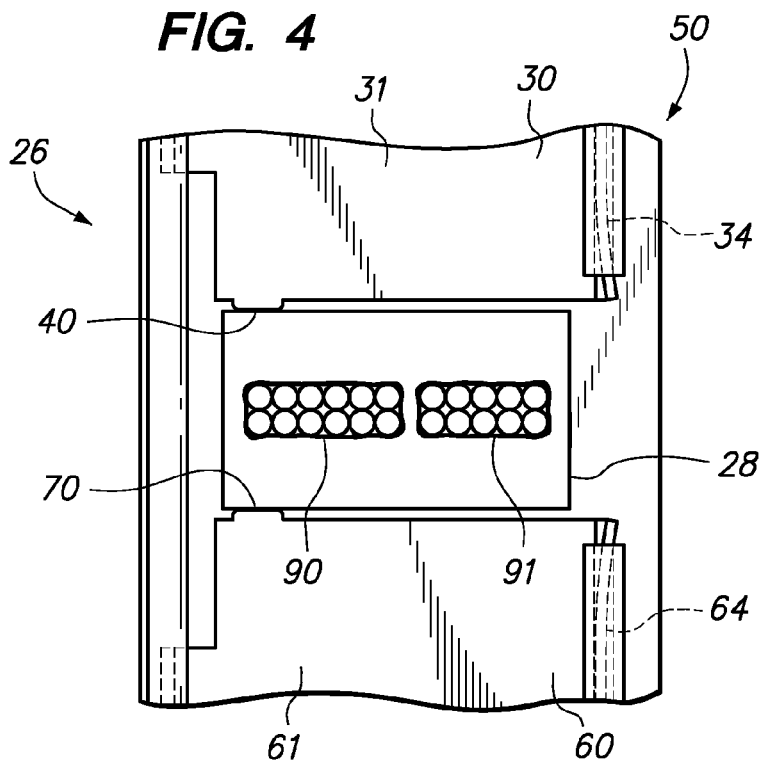

BIASED AIR BAFFLE FOR COMPUTER RACK

BACKGROUND OF THE INVENTION

1. Field of the Invention

The present invention relates to the routing of cables in a computer system chassis or rack having forced air circulation.

2. Description of the Related Art

Cables are often used to make connections to and between computer system components. For example, cables are frequently used to make various data and power connections to rack-mounted computer equipment in a data center. These cables may be routed through various openings, often in bundles. For example, cables may be routed from inside a rack to outside the rack, through an opening in the rack. Cables may also be routed from the controlled environment of the data center to an uncontrolled area outside the data center, such as through an opening in the wall, ceiling, or floor of the data center.

It is often desirable to minimize leakage of air from the various openings through which cables are routed. For example, because heat and humidity affect the operation of data center equipment, it is desirable to minimize airflow through the opening in the wall, ceiling, or floor through which cables are routed. Also, airflow is purposely generated through a rack to cool the rack-mounted components, so it is desirable to minimize air leakage from a rack. Conventional approaches attempting to reduce air leakage around cables include the use of brushes, plastic fingers, or foam positioned at an opening through which the cables pass.

SUMMARY OF THE INVENTION

According to one embodiment, a rack is configured for removably supporting a plurality of modular electronic components. The rack includes a cable opening for receiving a plurality of cables for connecting to the modular electronic components. A track is secured to the rack adjacent to the cable opening. The track includes at least a first rail guideway. An air baffle is movably supported on the track over the cable opening. The air baffle includes at least a flexible first rail movably received by the first rail guideway. The first rail is flared laterally along a range of engagement of the first rail with the first rail guideway.

Other details and embodiments of the invention will be apparent from the following description and the appended claims.

BRIEF DESCRIPTION OF THE DRAWINGS

FIG. 3 is a top, plan view of the air baffle assembly with the air baffles moved toward one another along the track to a closed position over the cable opening.

FIG. 3A is a schematic view of an alternative roller structure for movably supporting the air baffle at one of the guideways.

FIG. 4 is a top, plan view of the air baffle assembly with the air baffles moved apart to provide access to the cable opening.

DETAILED DESCRIPTION OF THE INVENTION

One embodiment of the invention provides an air baffle assembly for reducing airflow through a cable opening on a rack, such as a rack with a rear-door heat exchanger so that substantially all of the airflow through the rack exits through the rear-door heat exchanger without leakage through the cable opening. The air baffle assembly includes one or more air baffles adjacent to the cable opening. Each air baffle assembly includes a track and one or more air baffles movably supported on the track. The air baffles are longitudinally movable on the track to selectively cover at least a portion of the cable opening. Each air baffle includes one or more laterally flared rails received on a rail guideway of the track. Moving the air baffle longitudinally on the track toward an open position causes the one or more laterally flared rails to flex laterally, to bias the air baffle in the opposing longitudinal direction, toward a closed position. If the bias exceeds frictional resistance to movement of the air baffle, the bias of the air baffle will cause the air baffle to move toward the closed position. Cables may be routed through the cable opening, and the air baffle may then be moved toward the closed position, into engagement with the cables, to at least partially cover the cable opening and reduce airflow through the cable opening.

Figure 1:
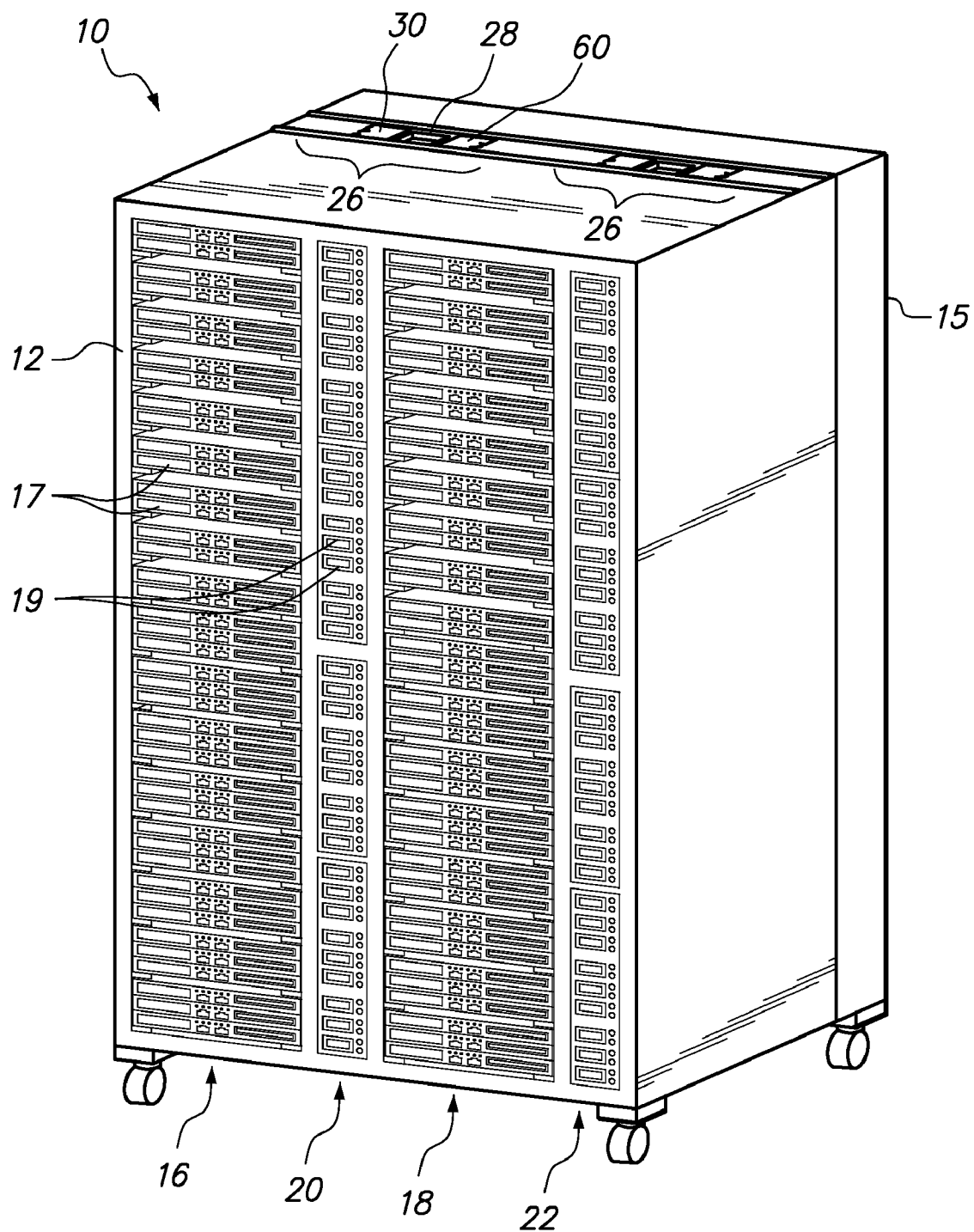
FIG. 1 is a perspective front view of a rack with a top panel having a plurality of air baffle assemblies to reduce airflow through cable openings in the rack.

FIG. 1 is a perspective front view of an exemplary rack 10 having an integrated rear-door heat exchanger 15. The rack 10 removably supports a plurality of modular electronic components ("modules") 17, 19 and provides access to the modules 17, 19 from the front 12 of the rack 10. The various modules are optionally arranged with high power modules 17 in two columnar "high-power zones" 16, 18, and comparatively low power modules 19 in adjacent "low-power zones" 20, 22. The modules 17 in the high-power zones 16, 18 include some processor-intensive compute modules, such as blade servers, having a motherboard and one or more processors. The modules 19 in the low-power zones 20, 22 may include devices for supporting the modules in columns 16, 18, such as network switches for providing network connectivity and power distribution units (PDUs) for distributing power. The rack 10 is merely an example of one of the many racks of different sizes and types that may be located throughout the data center.

The various modules 17, 19 generate heat as a byproduct of the power they consume. The processor-intensive modules 17 in the high-power zones 16, 18 typically contribute the majority of the heat generated by the rack 10. Fans are provided throughout the rack 10, such as in a plurality of chassis on the rack 10 that receive the modules 17, 19. The fans generate airflow through the rack 10 for cooling the modules 17, 19 and maintaining safe operating temperatures. The rack 10 and the chassis that support the modules 17, 19 are designed to route the airflow through the rack 10 in an efficient manner. The rear-door heat exchanger 15 cools the air exiting the rack 10. The rear-door heat exchanger 15 occupies the entire rear of the rack, to ensure all airflow exits the rack 10 through the rear-door heat exchanger 15 to maximize cooling. Due to the inclusion of the rear-door heat exchanger 10, a plurality of cable openings 28 are provided on the rack to route cables to and from the rack 10 while avoiding the rear-door heat exchanger 15. It is particularly desirable to minimize inadvertent leakage of air into or out of the top, bottom, or sides of the rack 10 so that substantially all of the airflow generated by the fans passes through the rear-door heat exchanger 15. Therefore, an air baffle assembly 26 according to one embodiment of the invention is placed at each opening 28 to minimize any leakage of airflow through openings 28.

Cables (not shown in FIG. 1) may be routed within the rack 10, and from the rack 10 to elsewhere in the data center, to provide power and data connectivity to the modules and other components and sub-systems of the rack 10. Some cables may be used to interconnect modules from the front 12 of the rack 10. For example, network switches in columns 20, 22 may be connected with cables to compute modules in adjacent columns 16, 18 at the front of the rack. Other cables may be routed from the rack 10 and another data center location. For example, power cables may be routed from a central AC power source in the data center to the rack 10, and then routed internally to the various chassis bays provided on the rack. Ethernet cables are another example of cables that may be routed to the rack from an external source, and which may then be routed internally to the network switches for providing network connectivity.

The various cables may be provided to the rack 10 from different locations. For example, some cables may be routed to the rack 10 through a raised floor in the data center, and other cables may be routed to the rack 10 from the ceiling. The cable openings 28 may be provided at various locations on the rack 10 for routing bundles of cables from inside the rack to outside the rack 10. Two cable openings 28 are shown by way of example, although any number of cable openings 28 may be provided at different locations on the rack 10 for bringing cables to the rack 10 at different locations. The air baffle assembly 26 is provided at each cable opening 28. Each air baffle assembly 26 in this embodiment has a pair of opposing, track-mounted air baffles 30, 60. The air baffles 30, 60 are shown in an open position in FIG. 1 to reveal the cable opening 28. The air baffles 30, 60 may be moved toward one another to at least partially cover the cable opening 28, for the purpose of minimizing airflow leakage through the cable opening 28. The air baffles 30, 60 may be biased toward the closed position, as explained further below.

Figure 2:
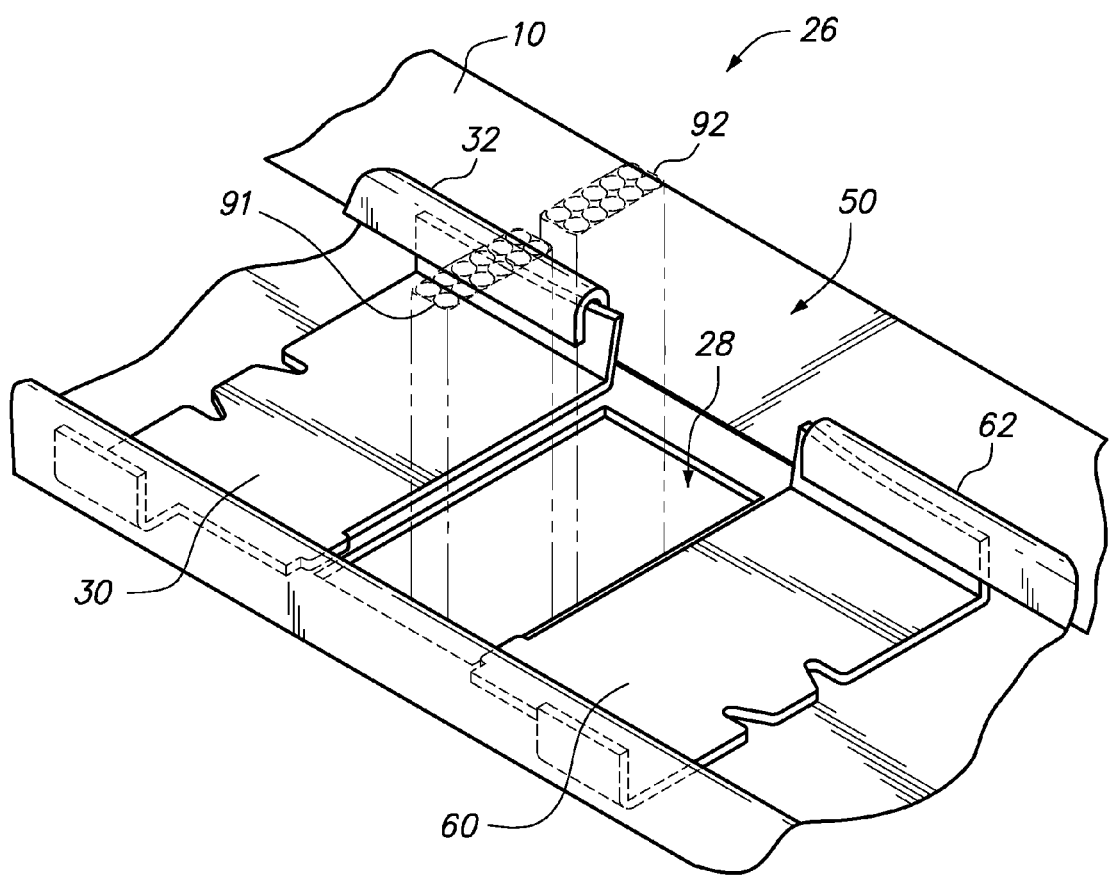
FIG. 2 is a perspective top view of the rack with two bundles of cables routed through one of the cable openings and an air baffle assembly used to reduce airflow through the cable opening.

FIG. 2 is a perspective top view of the rack 10 showing two bundles of cables 91, 92 routed through one of the cable openings 28 and one of the air baffle assemblies 26 used to control airflow through the cable opening 28. The bundles of cables 91, 92 may include, for example, power cables and Ethernet cables for providing power and network connectivity to the various modules supported on the rack 10. The air baffle assembly 26 includes a track 50 secured to the rack 10. The air baffles 30, 60 are movably supported on the track 50. The track 50 includes a rail guideway 32 for movably supporting the first air baffle 30 and another rail guideway 62 for movably supporting the second air baffle 60. The opposing air baffles 30, 60 are movable toward one another, against the bundles of cables 91, 92 and at least partially covering the cable opening 28 to minimize airflow leaking from the rack 10 through the cable opening 28.

A variety of materials may be used to form the air baffles 30, 60. A variety of polymers or plastics provide a suitable level of flexibility for forming the flexible rails. The air baffles 30, 60 could be made of a transparent material, such as high-impact polycarbonate, to provide good visibility of the cables passing through the cable opening 28. Translucent air baffles 30, 60 would allow extra ambient light to enter the cabling area. In computing environments wherein electromagnetic compatibility (EMC) issues are a particular concern, the air baffles 30, 60 could be made of a conductive material to minimize the EMC aperture, especially when the baffles are fully closed.

FIG. 3 is a top, plan view of the air baffle assembly 26 of FIG. 2 with the air baffles 30, 60 moved toward one another along the track 50 to a closed position over the cable opening 28. The air baffle 30 includes a web 31 that spans the cable opening 28 from the rail guideway 32 to the opposing guideway 36. Similarly, the air baffle 60 includes a web 61 that spans the opening 28 from the rail guideway 62 to the opposing guideway 36. In the closed position, the web 31 of the air baffle 30 and the web 61 of the air baffle 61 block airflow through the opening 28. No cables are routed through the cable opening 28 in this view, so that the air baffles 30, 60 are able to be positioned close or substantially touching one another, as shown, while in the closed position. The air baffle 30 includes a flexible rail 34 received by the rail guideway 32. The rail 34 includes an outwardly flared portion 42. This embodiment of the rail guideway 32 includes a groove 35 into which the rail 34 is slidably inserted. The interconnection of the rail 34 into the groove 35 may support the air baffle 30 on the track 50 and guide the air baffle 30 such that the air baffle 30 is constrained to move only in a longitudinal direction (in the y-axis direction). An opposing guideway 36 also guides the air baffle 30 longitudinally. The air baffle 30 may include an opposing rail disposed in a groove on the guideway 36 (see, e.g., FIG. 5).

The structural interconnection of the air baffle 30 with the guideway 36 is not required to be identical to the structural interconnection of the air baffle 30 to the guideway 32. Furthermore, structural supports for the air baffle 30 may be distinct from the flared, flexible rail 34 used to bias the air baffle 30. For example, FIG. 3A (inset) is a schematic view conceptually illustrating an alternative structure for movably supporting an end 39 of the air baffle 30 at the guideway 36, without the use of a rail being disposed in a groove. Instead, rollers 37 are provided within a roller guide 38, providing a desirably low-friction structure that supports the end 39 of the air baffle. The decreased friction rollers 37 may reduce the force required to move the air baffle 30.

The structure and operation of the air baffle 60 substantially mirrors the structure of the air baffle 30. For example, the air baffle 60 includes a flexible rail 64 received by the rail guideway 62, with the rail 64 riding in a groove 65 in the rail guideway 62. The rail 64 has an outwardly flared portion 72. The air baffle 60 is movably supported on and guided by an opposing guideway 66. The guideway 66 and guideway 36 may be different sections of the same, continuous guideway used to engage both air baffles, as shown. Other details of the structure and operation of the air baffle 30 may be assumed to apply to the air baffle 60, even if not explicitly described herein.

As the air baffle 30 is moved longitudinally along the track 50, the flexible rail 34 slides within the groove 35 over a range of engagement between the rail 34 and the rail guideway 32. Moving the air baffle 30 longitudinally in the direction indicated by arrow A1 moves the rail 34 longitudinally in a direction of increasing insertion into the groove 35, causing the flared portion 42 of the rail 34 to flex laterally inwardly against the rail guideway 32. Similarly, moving the air baffle 60 in the direction A2 will move the rail 64 in a direction of increasing insertion into the groove 65, causing lateral flexure of the rail 64.

FIG. 4 is a top, plan view of the air baffle assembly 26 with the air baffles 30, 60 moved apart in the direction A1, A2 (see FIG. 3) to an open position, uncovering and providing access to the cable opening 28. Raised finger holds 40, 70 are optionally provided to facilitate moving the air baffles 30, 60 by hand. Multiple cables are bundled together in the generally rectangular bundles 90, 91. The two exemplary cable bundles 90, 91 may be routed through the opening 28 as shown. The rails 34, 64 are laterally flexed in response to having been moved further into the grooves 35. The progressive lateral flexure of the flared portion 42 against the rail guideway 32 and of the flared portion 72 against the rail guideway 62 provides a force component that biases the air baffles 30, 60 toward one another, opposite the directions A1, A2. The bias may be sufficiently large to overcome the frictional resistance to movement between each air baffle 30, 60 and the track 50, to automatically move the air baffles 30, 60 back toward one another against the cable bundles 90, 91. The generally rectangular shape of the cable bundles 90, 91 allows the leading edge of the air baffles 30, 60 to conform well to the bundles 90, 91. Even where the bias does not exceed the frictional resistance between the air baffles 30, 60 and the track 50, the bias still opposes the movement of the air baffles 30, 60 away from one another, resulting in a "controlled friction" that helps to maintain the air baffles 30, 60 in their position against the cable bundles 90, 91.

The bias provided by the mechanical interaction between the flexible rails 34, 64 and the rail guideways 32, 62 may be enhanced in a number of ways, including by increasing the rigidity of the rails 34, 64. However, the effort required to move the air baffles 30, 60 apart by hand should also be considered when selecting the rigidity of the rails 34, 64. The bias may also be enhanced by minimizing frictional resistance to the movement of the air baffles 30, 60 on the track 50, such as by using a low-friction polymer material for forming the rails 34, 64 or the track 50, or by using the optional low friction rollers detailed in FIG. 3A or other low-friction structural interconnection between the air baffles 30, 60 and the track 50. Increasing the bias and/or decreasing the frictional resistance to the movement of the air baffles 30, 60 increases the tendency of the bias to move the air baffles 30, 60 toward one another without having to manually move the air baffles 30, 60 toward one another by hand. Even if the air baffles 30, 60 must still be moved by hand toward one another, the bias will tend to hold the air baffles 30, 60 in position against the cable bundles 90, 91 and should allow the air baffles 30, 60 to be closed with less manual force than required to open the air baffles.

Figure 5:
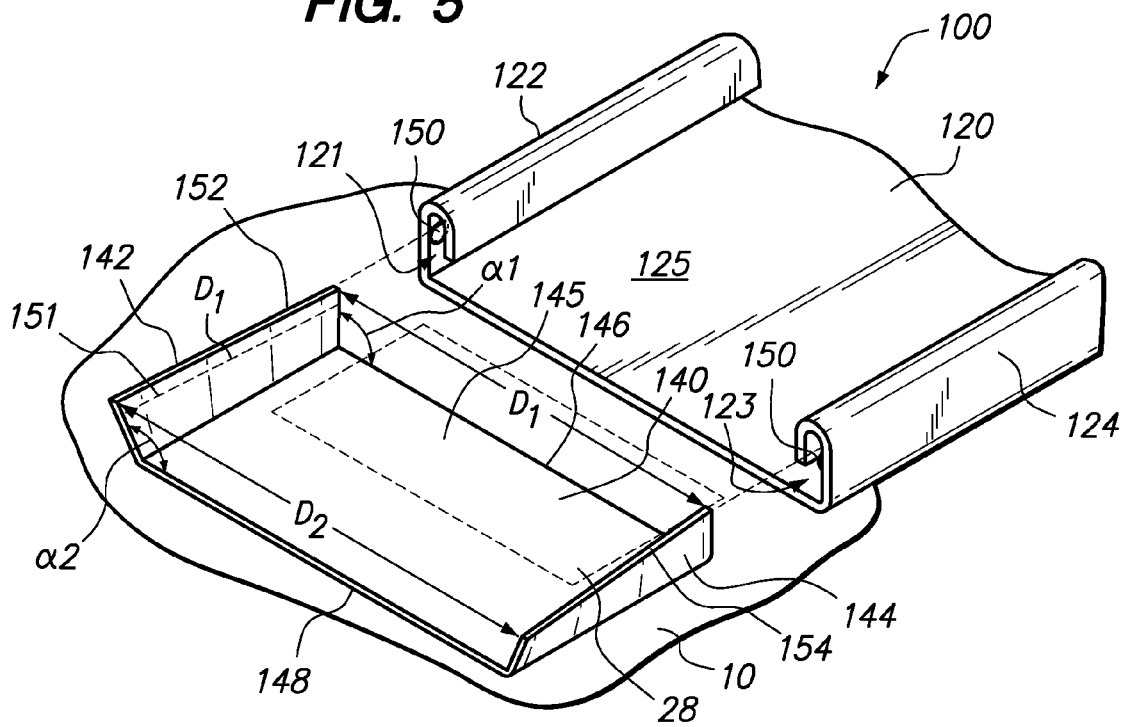
FIG. 5 is a perspective assembly view of an alternative embodiment of an air baffle assembly including an air baffle with two flared rails movably supportable on a track.

FIG. 5 is a perspective assembly view of an alternative embodiment of an air baffle assembly 100 including an air baffle 140 having two flared rails movably supportable on a track 120. The air baffle 140 includes a pair of laterally opposed, longitudinally extending flared rails 142, 144. The track 120 includes opposing rail guideways 122, 124 defining grooves 121, 123 for movably receiving the rails 142, 144, respectively. A rounded protuberance or "bump" 150 is optionally disposed in the grooves 121, 123 of the rail guideways 122, 124 to provide a contact point with the rails 142, 144 at the entrance to the grooves 121, 123. As best seen on the rail 142, the bump 150 slidingly engages the rails 142, 144 along a line of contact 151 on the outwardly facing surface of the rails 142, 144. The track 120 may be secured to the rack 10 over one of the cable openings 28 of FIG. 1, so that the air baffle 140 may be moved along the track 120 to selectively cover or close at least a portion of the cable opening 28. A pair of the air baffle assemblies 100 may be secured to the rack 10 at opposing ends of the cable opening 28, so that the air baffles 140 of both air baffle assemblies 100 are movable to selectively cover or close the cable opening 28. However, a single air baffle assembly 100 may provide enough travel between the air baffle 140 on the track 120 to close or cover the cable opening 28 for the purpose of reducing or minimizing the leakage of air from the rack 10.

The air baffle 140 includes a web 145 connecting the laterally opposing rails 142, 144. The web 145 is optionally supported by a planar surface 125 of the track 120. The rails 142, 144 are laterally, outwardly flared (in a relaxed stated), such that a spacing between the rails 142, 144 along the line of contact 151 increases continuously from a spacing D1 at or near a proximal end 146 of the air baffle 140 to a distance D2 at an opposing, distal end 148 of the air baffle 140. The spacing D1 is substantially equal to a spacing between the grooves 121, 123 on the track 120, for ease of assembly, allowing the rails 142, 144 to be easily inserted into the grooves 121, 123 from the proximal end 146 of the air baffle 140. In this embodiment, the spacing increases from the proximal end 146 to the distal end 148 due to an increasing angle between each of the rails 142, 144 and the web 145 connecting the rails 142, 144. In particular, the angle $\alpha 1$ between each of the rails 142, 144 and the web 145 at the proximal end 146 is approximately ninety degrees, which matches the ninety-degree angle between grooves 121, 123 and the planar surface 125 of the track 120, further facilitating insertion of the proximal end 146 of the air baffle 140 onto the track 120. The rails 142, 144 each flare outwardly to an angle $\alpha 2$ of about one hundred thirty-five degrees with respect to the web 145 at the distal end 148. It should be recognized that the angle of the grooves may be altered to be greater or less than ninety-degrees, preferably with corresponding changes in the angles of the rails.

Figure 6:
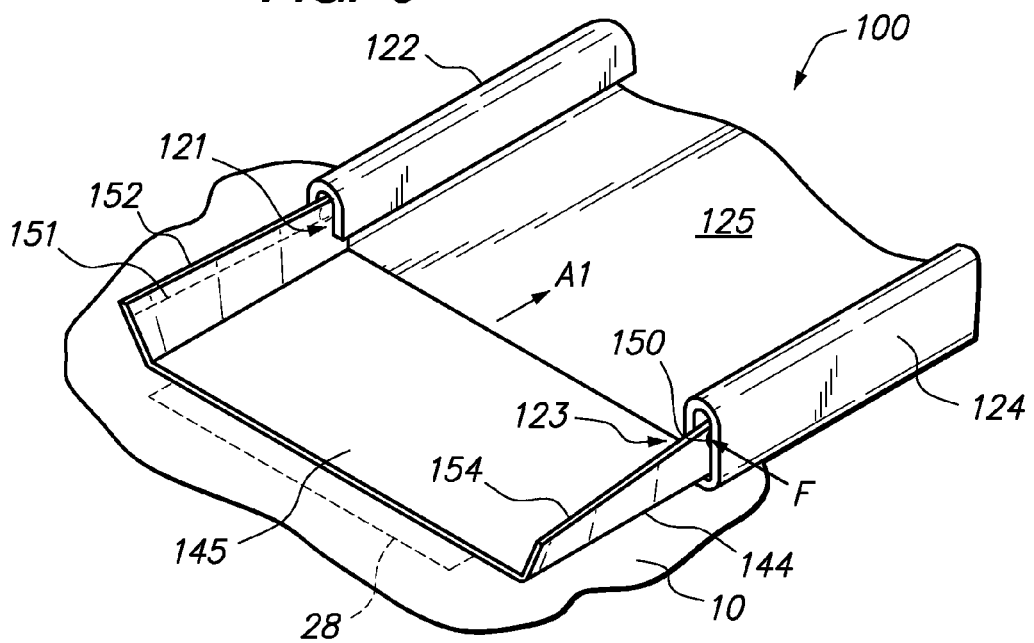
FIG. 6 is a perspective view of the air baffle assembly with the air baffle movably received on and supported by the track.

FIG. 6 is a perspective view of the air baffle assembly 100 with the air baffle 140 movably received on and supported by the track 120. The rails 142, 144 of the air baffle 140 are slidably received within the grooves 121, 123 of the rail guideways 122, 124 and the web 145 of the air baffle 140 is in close proximity with the surface 125 of the track 120. Advancing the air baffle 140 along the track 140 in the direction A1 moves the rails 142, 144 further into the grooves 121, 123, which results in inward flexure of the outwardly flared rails 142, 144 in response to a reaction force F of the rail guideways 122, 124 on the rails 142, 144. The flexure of the rails generates a bias that opposes movement of the air baffle 140 in the direction A1.

The optional bump 150 desirably controls the boundary condition between the rails 142, 144 and the rail guideways 122, 124. The bump 150 is also located near the top of the grooves 121, 123, such that the force F is applied near the edges 152, 154 of the rails 142, 144. Depending on the thickness of the web 145, the reaction force F on the rails 142, 144 might tend to cause the web 145 to bow slightly. However, the close proximity of the planar surface 125 to the web 145 helps support the web 145 to resist any bowing, and creates a good air seal between the web 145 and the surface 125.

The rails in the embodiments of FIGS. 5-6 flare laterally outwardly, as described above. Alternatively, the rails 142, 144 may be formed to flare laterally inwardly, such that the spacing between rails along the line of contact 151 decreases from the proximal end 146 to the distal end 148 of the air baffle 140. For example, the angle of the rails 142, 144 with respect to the web 145 may range in angle from ninety degrees at the proximal end 146 to forty-five degrees at the distal end. As a result, the rails 142, 144 would flex laterally outwardly as the air baffle 140 is moved in the direction of A1 to increase insertion of the rails 142, 144 into the grooves 121, 123. Preferably, the bump 150 would be positioned against an inner surface of the grooves 121, 123 to make contact with the rails. The laterally outward flexure would result in a similar bias on the air baffle 140, opposite the direction A1. Thus, it is a matter of design choice whether to form the air baffle 140 with the rails flared laterally inwardly or outwardly. The geometry or dimensions of the rack or other location of the air baffle assembly 100 may influence the choice to form rails that flare laterally outward or laterally inward.

Any number of laterally flared, flexible rails may be selected for an air baffle according to different embodiments of the invention. The embodiment of FIGS. 3-4 includes a single laterally flared, flexible rail per air baffle. The embodiment of FIGS. 5-6 includes two opposing laterally flared, flexible rails per air baffle. While the single flared rail of the embodiment shown in FIGS. 3-4 is sufficient to produce a useful bias, the pair of opposing rails in the embodiment of FIGS. 5-6 provides symmetry about a longitudinal centerline of the air baffle that provides a more balanced biasing of the air baffle. Still other embodiments may include three or more flexible rails per air baffle. For example, the ends of the air baffle could be supported on a track, and any number of flared rails on the air baffle between the ends could be slidably disposed in corresponding guideways on a track. Increasing the number of rails may generally increase the biasing force.

Figure 7:
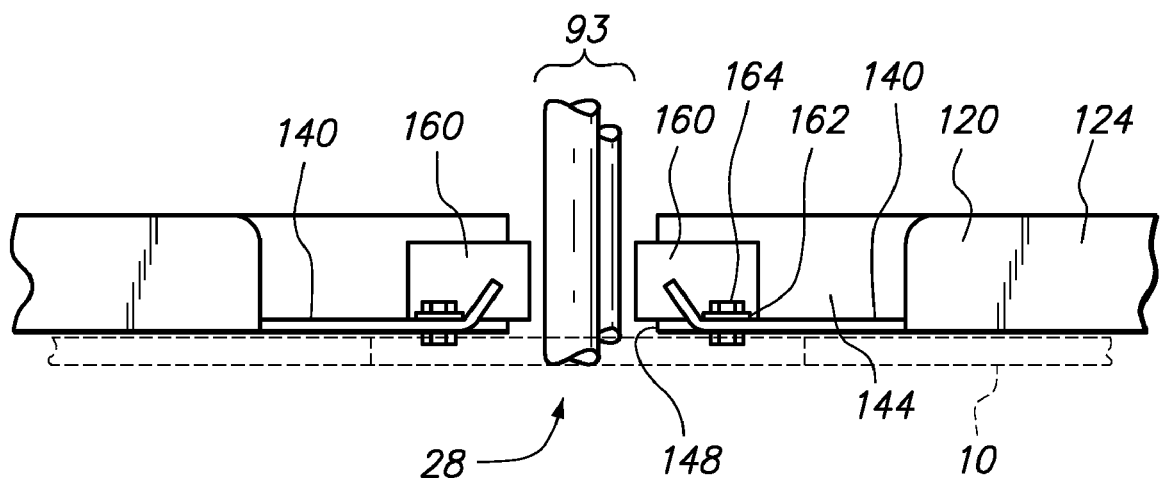
FIG. 7 is a side view of another embodiment incorporating a replaceable, compliant foam member secured to the distal end of each air baffle.

FIG. 7 is a side view of another embodiment incorporating a replaceable, compliant foam member 160 secured to the distal end 148 of each air baffle 140. Cables 93 pass through the opening 28 in the rack 10. As the air baffles 140 are moved further toward one another in the direction indicated, the compliant foam members 160, rather than the rigid distal end 148 of each air baffle 140, will contact the cables 93. The foam member 160 will elastically deform against the cables 93, to further reduce airflow through the cable opening 28.

Over time, with repeated use, the foam member 160 may undergo a permanent shape change or "set" that may reduce its efficacy in reducing airflow through the cable opening 28. To account for this possibility, the foam member 160 is replaceable. The foam member 160 is bonded to a mounting plate 162, and the mounting plate 162 is removably secured to the air baffle 140 with hardware 162, such as a screw or bolt. The hardware 162 may be unfastened to remove the old foam member 160, and a new foam member may be attached to the air baffle 140 with the hardware 162.

Using an air baffle to control airflow through a cable opening on a rack having a rear-door heat exchanger is just an example of the many possible uses of an air baffle according to an embodiment of the invention. Other embodiments may provide an air baffle to control airflow through cable openings at other locations in a data center. For example, even a rack with no rear-door heat exchanger may have a cable opening with which an air baffle may be used to prevent leakage and maximize airflow through the rack. Cable openings may also be provided at locations other than on a rack, such as on a wall, ceiling, or raised floor of the data center. According to another embodiment of the invention, therefore, an air baffle could be used to minimize the leakage of air through the cable opening from the controlled environment of the data center to an uncontrolled area outside the data center.

The air baffles in the embodiments described above are relatively simple and inexpensive to manufacture. The flexible rails provide a "built-in" bias that does not require the use of, for example, coil springs or cams. The air baffle can be formed unitarily with the one or more laterally-flared rails, such as in a plastic mold. The air baffle assembly has a low profile and can fit into confined spaces wherein conventional devices for minimizing airflow, such as foam, would otherwise be impractical.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
a rack configured for removably supporting a plurality of modular electronic components, the rack including a cable opening for receiving a plurality of cables for connecting to the modular electronic components;
a track secured to the rack adjacent to the cable opening, the track including at least a first rail guideway; and
an air baffle movably supported on the track over the cable opening, the air baffle including at least a flexible first rail movably received by the first rail guideway, the first rail flared laterally along a range of engagement of the first rail with the first rail guideway.

2. The apparatus of claim 1, further comprising:
the track including a second rail guideway laterally spaced from the first rail guideway; and
the air baffle including a flexible second rail laterally spaced from the first rail, the second rail movably received by the second rail guideway and flared laterally along a range of engagement of the second rail with the second rail guideway.

3. The apparatus of claim 2, wherein the first and second rail laterally flare in opposite directions.

4. The apparatus of claim 2, wherein the first and second rail guideways and the first and second rails cooperatively support the air baffle on the track.

5. The apparatus of claim 2, wherein the air baffle further comprises a web connecting the first and second rails, and wherein an angle between the first rail and the web and an angle between the second rail and the web both increase in one longitudinal direction over the range of contact of the first and second rails with the first and second rail guideways.

6. The apparatus of claim 5, wherein the angle between the first rail and the web varies continuously between about ninety degrees and one hundred thirty-five degrees along the range of engagement of the first rail with the first rail guideway and the angle between the second rail and the web varies continuously between about ninety degrees and one hundred thirty-five degrees along the range of engagement of the second rail with the second rail guideway.

7. The apparatus of claim 2, further comprising:
the air baffle including a web connecting the first and second rails; and
the track including a web support surface connecting the first and second rail guideway, wherein the web is in sliding contact with the web support surface.

8. The apparatus of claim 7, wherein the web is in substantially sealing contact with the web support surface.

9. The apparatus of claim 1, wherein the first rail flares laterally inwardly.

10. The apparatus of claim 1, wherein the first rail flares laterally outwardly.

11. The apparatus of claim 1, wherein the first rail guideway comprises a groove and the first rail is received within the groove.

12. An apparatus, comprising:
a rack configured for removably supporting a plurality of modular electronic components, the rack including a cable opening for receiving a plurality of cables connected to the modular electronic components;
a track secured to the rack adjacent to the cable opening, the track including first and second laterally spaced rail guideways; and
first and second air baffles movably supported on the track at opposing ends of the cable opening, the first and second air baffles each including a first flexible rail received by the first and rail guideway and a second flexible rail received by the second rail guideway, the first and second rails flared laterally along a range of engagement of the first and second rails with the first and second rail guideways, the first and second air baffles being movable along the track alternately toward or away from one another to selectively cover at least a portion of the cable opening.

13. The apparatus of claim 12, wherein the first and second rail flare laterally outwardly.

14. The apparatus of claim 12, wherein the first and second rail flare laterally inwardly.

15. The apparatus of claim 12, wherein the first rail guideway comprises a first groove slidingly receiving the first rail and the second rail guideway comprises a second groove slidingly receiving the second rail.

16. The apparatus of claim 15, further comprising a first protuberance disposed in the first rail guideway and in sliding contact with a flared portion of the first rail and a second protuberance disposed in the second rail guideway and in sliding contact with a flared portion of the second rail.

17. The apparatus of claim 12, wherein the air baffle further comprises a web connecting the first and second rails, and wherein an angle between the first rail and the web and an angle between the second rail and the web both increase in one longitudinal direction over the range of contact of the first and second rails with the first and second rail guideways.

18. The apparatus of claim 17, wherein the angle between the first rail and the web varies continuously between about ninety degrees and one hundred thirty-five degrees along the range of engagement of the first rail with the first rail guideway and the angle between the second rail and the web varies continuously between about ninety degrees and one hundred thirty-five degrees along the range of engagement of the second rail with the second rail guideway.

19. The apparatus of claim 12, further comprising:
a foam member secured to a distal end of the air baffle over the cable opening.

20. The apparatus of claim 19, further comprising:
a mounting plate for removably securing the foam member to the air baffle.

* * * * *